United States Patent [19]

Appenzeller et al.

[11] Patent Number: 5,508,641
[45] Date of Patent: Apr. 16, 1996

[54] INTEGRATED CIRCUIT CHIP AND PASS GATE LOGIC FAMILY THEREFOR

[75] Inventors: David P. Appenzeller, Essex Junction; Peter Wohl, Williston, both of Vt.

[73] Assignee: International Business Machines Corporation, Armonk, N.Y.

[21] Appl. No.: 359,971

[22] Filed: Dec. 20, 1994

[51] Int. Cl.$^6$ .............................................. H03K 19/0948
[52] U.S. Cl. ............................ 326/113; 326/121; 326/17; 326/24
[58] Field of Search .................................... 326/112, 119, 326/121–122, 17, 21, 23–24, 113–114

[56] References Cited

U.S. PATENT DOCUMENTS

| | | | |
|---|---|---|---|
| 4,233,524 | 11/1980 | Burdick | 307/205 |
| 4,620,117 | 10/1986 | Fang | 307/451 |
| 4,646,306 | 2/1987 | David et al. | 371/49 |
| 4,709,346 | 11/1987 | Henlin | 364/784 |
| 4,710,649 | 12/1987 | Lewis | 307/451 |
| 4,713,790 | 12/1987 | Kloker et al. | 364/784 |
| 4,716,312 | 12/1987 | Mead et al. | 307/475 |
| 4,798,980 | 1/1989 | Sugiyama et al. | 307/471 |
| 4,888,499 | 12/1989 | Sanwo et al. | 307/471 |
| 4,912,665 | 3/1990 | Waller et al. | 364/716 |
| 5,015,881 | 5/1991 | Chappell et al. | 307/449 |
| 5,039,883 | 8/1991 | On | 307/465 |
| 5,126,596 | 6/1992 | Millman | 307/451 |
| 5,155,387 | 10/1992 | Fletcher et al. | 307/446 |
| 5,218,246 | 6/1993 | Lee et al. | 307/471 |

FOREIGN PATENT DOCUMENTS

| | | | |
|---|---|---|---|
| 1-181321 | 7/1989 | Japan | 326/113 |
| 5-152936 | 6/1993 | Japan | 326/113 |

OTHER PUBLICATIONS

J. S. Hiltebeitel, CMOS XOR, IBM Technical Disclosure Bulletin, V. 27, #4B Sep. 1984, p. 2639.

M. R. Ouellette, et al, Fast Carry Sum Adder, IBM Technical Disclosure Bulletin, V. 30, #5, Oct. 1987, pp. 323–324.

K. Yano, et al., A 3.8–ns CMOS 16×16–b Multiplier Using Complementary Pass–Transistor Logic, IEEE, 1990.

C. Heikes, A 4.5mm2 Multiplier Array For A 200MFlop Pipelined Coprocessor, Digest of Technical Papers, High-–Performance Logic Circuit Techniques, Paper FA 18.1, Session 18, ISSCC94, pp. 290–291.

H. Partovi, et al., A Regenerative Push–Pull Differential Logic Family, IEEE International Solid–State Circuits Conference, Digest of Technical Papers, High–Performance Logic Circuit Techniques, FA 18.3, Session 18, ISSCC94, pp. 294–295.

*Primary Examiner*—Edward P. Westin
*Assistant Examiner*—Jon Santamauro
*Attorney, Agent, or Firm*—Charles W. Peterson, Jr.; Donald D. Mondul

[57] ABSTRACT

An integrated circuit chip with high level logic functions formed from a pass gate logic family. The logic for each logic book includes at least one pass gate. Each book has complementary outputs and a pseudo latch attached to its outputs. If the book is of one FET type, the pseudo latch is of the opposite type. Books are placed in the logic function such that the output pseudo latches redrive opposite logic levels on alternating stages of series-connected books.

23 Claims, 4 Drawing Sheets

INTEGRATED CIRCUIT CHIP AND PASS GATE LOGIC FAMILY THEREFOR

FIELD OF THE INVENTION

The present invention relates generally to Integrated Circuit Chips and more particularly to Integrated Circuit Chips having CMOS pass gate logic circuits.

BACKGROUND OF THE INVENTION

Higher speed, smaller size and lower power are primary circuit design objectives. CMOS circuits have inherently lower power with higher performance than other NMOS or PMOS and, in many applications, bipolar circuits. However, CMOS circuits tend to be much larger than a corresponding NMOS or PMOS circuit. Therefore, in some instances pass gates are employed, sparingly, to reduce circuit size without increasing power or losing speed. Unfortunately, pass gates do not pass both logic levels fully, exhibit a large input capacitance (which includes the pass gate's load) and, the number of series connected pass gates must be limited.

Pass gates do not pass both logic levels fully because each pass gate, which is an FET, has a minimum gate to source turn-on voltage $V_T$ that must be maintained to keep the pass gate turned on. Thus, a PFET with its gate grounded, can pass a full high level, $V_H$, but cannot pull down an output lower than $V_{Tp}$. An NFET pass gate, on the other hand, with its gate at $V_H$ can fully pass a low providing 0V at its output but, passes no higher than $V_H\text{-}V_{Tn}$. Thus, as a signal is propagated through series connected PFET and NFET pass gates, its levels are attenuated from $V_H$ and 0V to $V_H\text{-}V_{Tn}$, and $V_{Tp}$. This attenuation severely reduces circuit noise margin, increases power dissipation in subsequent circuits and may slow overall circuit performance somewhat. Noise margin is reduced because the signal voltage swing is reduced. Power dissipation is increased because subsequent stages driven by the attenuated signal have higher flush current. Flush current results when in an inverter, for example, both the PFET and the NFET are on. So, instead of being directed to or from a load, current is flowing between $V_H$ and ground through both devices. Because pass gate pass attenuated signals, one or both FETs may not turn completely off, allowing continuous current to flow through the following stage. Subsequent circuit performance is slowed both because the drive to the following stage's PFETs and NFETs is reduced from the pass gate's reduced drive voltage and because drive current from that following stage is diverted as flush current instead of for driving its load.

Input capacitance, which determines circuit fan-in, is higher for pass gate circuits than for other circuit types for two reasons. First, instead of just FET gate capacitance, the input capacitance is channel capacitance source diffusion capacitance and drain diffusion capacitance. These three types of capacitance are normally much higher than FET gate capacitance. Second, because the pass gate is on, a substantial portion of the pass gate's load capacitance is passed back through the pass gate to the input.

The number of series connected pass gates must be limited, because, for the foregoing reasons, signal degradation, as well as delays become severe. Loads at each stage coupled with pass gate channel resistance form an RC network to filter the propagating signal. The signal loss at each stage exacerbates the problems of single stage attenuation. The filtered signal must be redriven frequently or intolerable signal loss occurs.

Prior art approaches to these problems with pass gate logic have been primarily to buffer pass gate stages periodically, with, for example, an inverter at the passgate's input or output. However, buffering adds unwanted additional stage delay. Another prior art approach is to use a single FET type for pass gates and to reinforce the resulting attenuated logic levels, at each pass gate output. Unfortunately, level reinforcement, places further constraints on the number of series connected pass gates. This additional constraint is required because, eventually, with enough series connected passgates, the gates effectively become a voltage divider. Some of the final stages would not switch at all, with intervening stages pulled only to intermediate levels.

PURPOSE OF THE INVENTION

It is a purpose of the invention to improve logic circuit performance.

It is another purpose of the invention to reduce logic circuit area.

It is yet another purpose of the invention to improve logic circuit performance, while reducing circuit areas and without substantially increasing circuit power dissipation.

It is yet another purpose of the invention to improve pass gate circuit signal levels.

It is yet another purpose of the invention to increase the limit on the number of stages allowed for series connected pass gate logic.

It is yet another purpose of the invention to improve pass gate circuit fan in.

SUMMARY OF THE INVENTION

The present invention is a logic family for forming high level logic functions and the integrated circuit chip formed from the logic family. The said logic family includes a plurality of logic books, or blocks, or cells, with complementary outputs and each of the logic books has a pseudo latch connected to its complementary outputs. Opposite logic levels are redriven on alternate series connected logic books.

DESCRIPTION OF THE PREFERRED EMBODIMENT

The present invention is a logic family with pseudo-latched outputs, wherein for series connected pass gate books opposite levels are reinforced at alternating stages, i.e., "High", then "Low", then "High", then "Low", etc. The logic family is implemented in Complementary Metal Oxide Semiconductor (CMOS) technology. However, the circuits are not typical CMOS circuits wherein each N-type Field Effect Transistor (NFET) is paired with a P type FET (PFET) providing an essentially complementary function. Unlike traditional CMOS logic, the P and N devices in each circuit of the logic family of the present invention are not paired, logically complementing each other. There are, however, both P and N devices in each individual circuit. Instead, for logic books of the present invention, each book includes a logic function and its complement and both are implemented as open drain logic (sometimes called open collector logic). The load for this open drain logic is a pseudo latch that drives or redrives the book's complementary pair of outputs to full voltage levels ($V_{DD}$ or Ground).

In a first preferred embodiment, the logic function in each book is implemented entirely in one FET type while the output pseudo latch is of the other FET type. For convenience, logic books in this first preferred embodiment logic family are typed according to the type of FET implementing the logic function. To avoid problems associated with pass gate logic, especially cascading pass gate logic circuits, a minor constraint is placed on logic design using the preferred embodiment logic family. That constraint is that when two or more books are used sequentially, two identical book types cannot be placed sequentially, i.e. if one is P-type book, then the other must be an N-type book and vice versa. The effect of this constraint, is that every high level or low level propagating through the logic is redriven (and refreshed) at every other stage. Advantageously, however, there is no restriction on the number of series connected books.

Figure 1A:
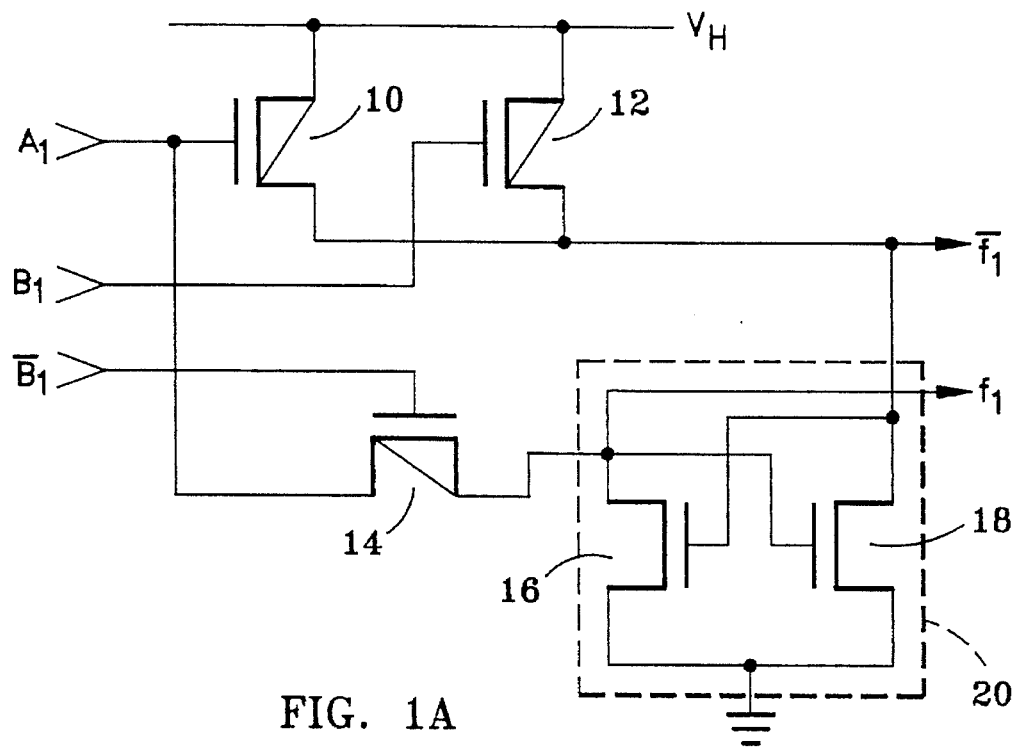
FIGS. 1A–B are schematic diagrams of the AND/OR circuits of the first preferred embodiment logic family.
Figure 1B:
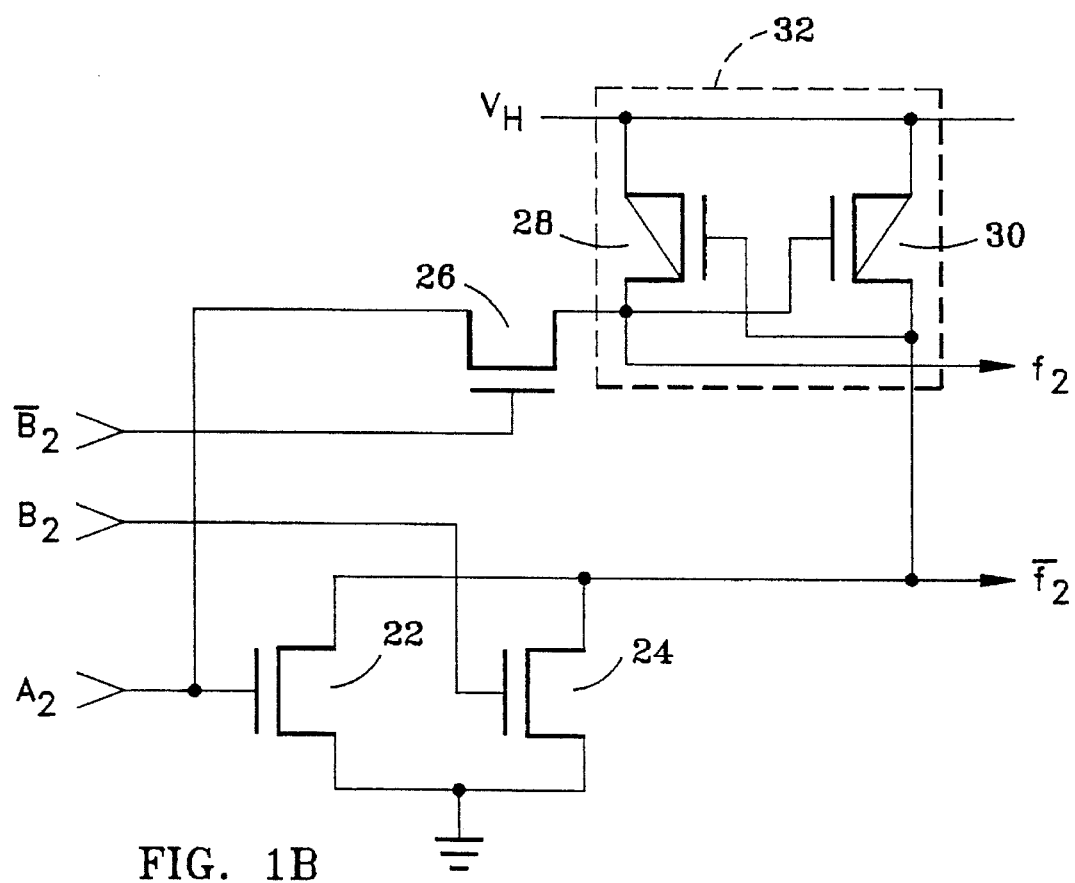

FIGS. 1A and 1B are schematics of the AND/OR circuits of the first preferred embodiment logic family. The P-type book is the two input AND circuit of FIG. 1A and the N-type book is the two input OR circuit of FIG. 1B.

In FIG. 1A, PFETs 10 and 12 provide a NAND function and are each connected, drain to source, between $\bar{f}_1$ and supply voltage $V_H$. Inputs $A_1$ and $B_1$ are each connected to the gates of PFETs 10 and 12 respectively. Pass gate PFET 14 is connected, drain to source, between $f_1$ and input $A_1$. Input $\bar{B}_1$ is connected to the gate of pass gate 14, providing the AND of $A_1$ and $B_1$. Cross coupled NFETs 16 and 18 are connected, drain to source, between ground and the outputs $f_1$, $\bar{f}_1$, respectively. NFETs 16 and 18 form the pseudo latch 20 at the book's output $f_1$, $\bar{f}_1$, providing a solid low level to $f_1$ ($\bar{f}_1$) whenever $\bar{f}_1(f_1)$ is high. With $\bar{f}_1$ high, NFET 16 is on grounding $f_1$ and NFET 18 is off. If both $A_1$ and $B_1$ go high, PFET 14 passes a high pulling $f_1$ high, turning 18 on to pull $\bar{f}_1$ low. With $\bar{f}_1$ low, 16 is turned off. Either $A_1$ or $B_1$ going low, turns on PFET 10 or 12 respectively, pulling $\bar{f}_1$ high. $\bar{f}_1$ high turns 16 on which pulls $f_1$ low turning 18 off. Thus, $f_1=A_1 \cdot B_1$ and $\bar{f}_1=\overline{A_1 \cdot B_1}$. It is understood that by inverting $A_1$ and $B_1$, $f_1=\overline{A_1+B_1}$ and $\bar{f}_1=A_1+B_1$.

In FIG. 1B, a NOR function $\bar{f}_2$ is provided by NFETs 22 and 24, which are each connected, drain to source, between $\bar{f}_2$ and Ground. Inputs $A_2$ and $B_2$ are each connected to the gates of NFETs 22 and 24 respectively. Pass gate NFET 26 is connected, drain to source, between $f_2$ and input $A_2$. Input $\bar{B}_2$ is connected to the gate of pass gate 26, providing the logical OR of $A_2$ and $B_2$. Cross coupled PFETs 28 and 30 are connected, drain to source, between $V_H$ and the outputs $f_2$, $\bar{f}_2$ respectively. PFETs 28 and 30 form the pseudo latch 32 at the books output $f_2$, $\bar{f}_2$, providing a solid high level to $f_2$ ($\bar{f}_2$) whenever $\bar{f}_2(f_2)$ is low. With $\bar{f}_2$ low, PFET 28 is on holding $f_2$ high and PFET 30 off. If both $A_2$ and $B_2$ go low, NFET 26 passes a low pulling $f_2$ low, which turns 30 on to drive $\bar{f}_2$ high. With $\bar{f}_2$ high, 28 is turned off. Either $A_2$ or $B_2$ going high, turns on NFET 22 or 24 respectively, pulling $\bar{f}_2$ low. Pulling $\bar{f}_2$ low, turns PFET 28 on which pulls $f_2$ high turning 30 off. Thus, $f_2=A_2+B_2$ and $\bar{f}_2=\overline{A_2+B_2}$. It is also understood that by inverting $A_2$ and $B_2$, $f_2=\overline{A_2 \cdot B_2}$ and $\bar{f}_2 A_2 \cdot B_2$.

Figure 2A:
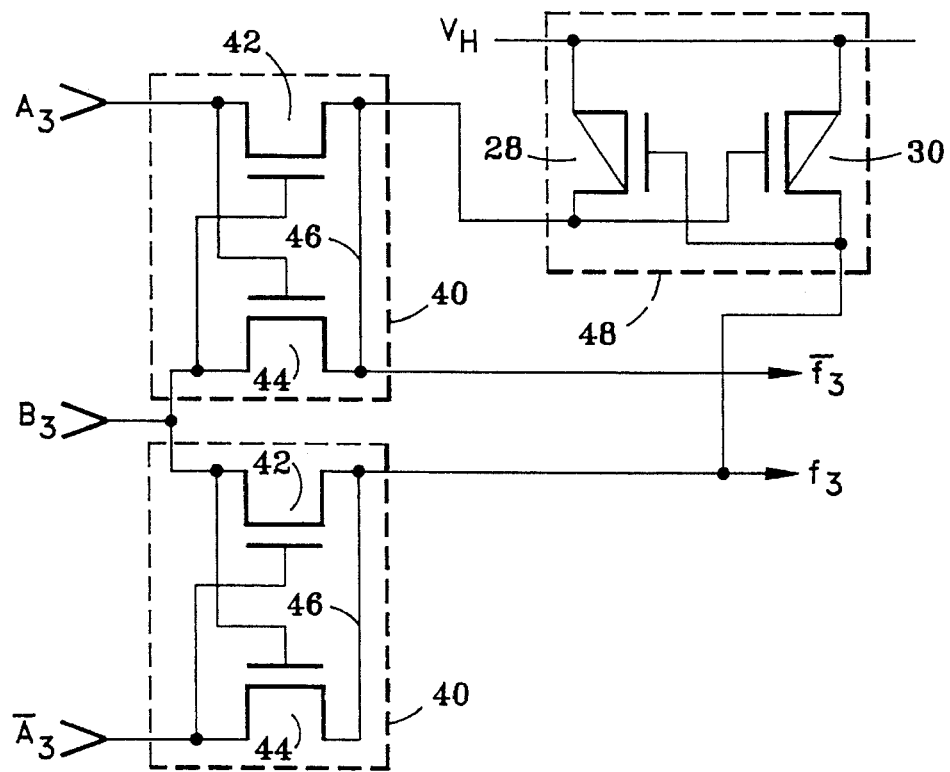
FIGS. 2A–B are schematic diagrams of the XOR/XNOR circuits of the first preferred embodiment logic family.
Figure 2B:
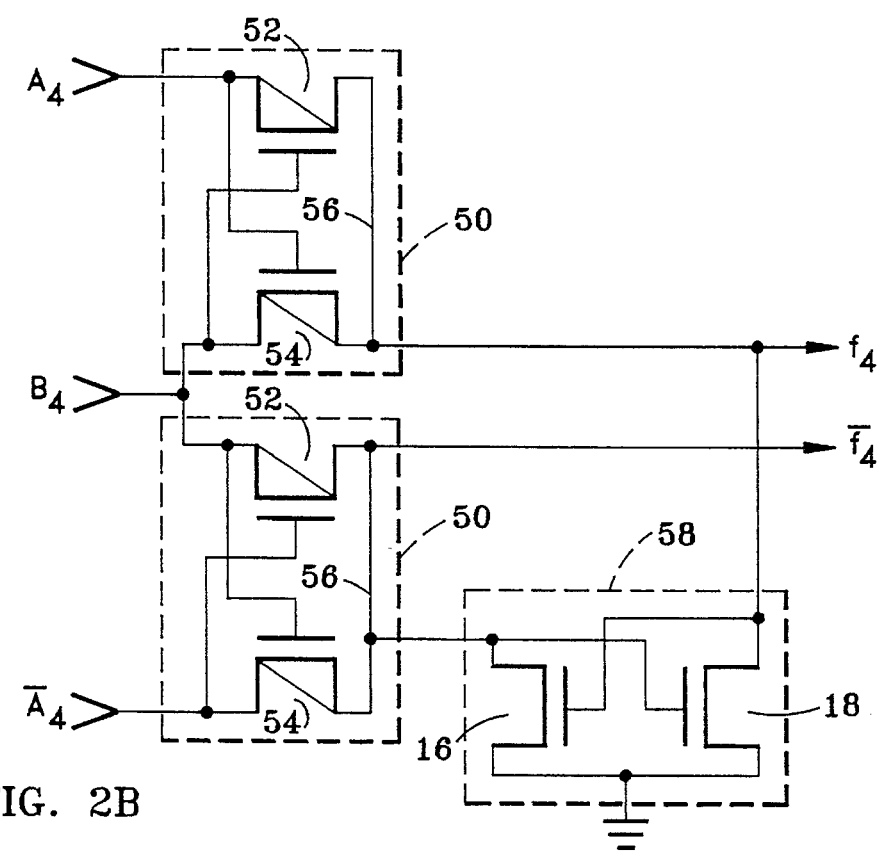

FIGS. 2A and 2B are schematics of the N book and P book XOR/XNOR function of the first preferred embodiment logic family of the present invention. In FIG. 2A, two identical XNOR circuits 40 receive inputs $A_3$, $B_3$ and $\bar{A}_3$ and generate, by virtue of inverted input $\bar{A}_3$, an XOR output $f_3$ and an XNOR output $\bar{f}_3$. Each XNOR circuit 40 is a pair of cross coupled NFETs. The XNOR input pairs $A_3$, $B_3$ or $\bar{A}_1$, $B_3$ are at the NFET 42, 44 drains. The cross coupled NFETs 42, 44 are connected together at their drains providing the XNOR function output 46. The N-book's output latch 48 is identical to the output pseudo latch 32 of FIG. 1B and provides additional drive to pull $f_3$ or $\bar{f}_3$ to $V_H$. The output pseudo latch 48 operates as described for pseudo latch 32 above.

The circuit of FIG. 2B is essentially equivalent to that of FIG. 2A with PFETs replacing NFETs and vice versa. Two identical XOR circuits 50 receive inputs $A_4$, $B_4$ and $\bar{A}_4$ and generate XOR output $f_4$ and, by virtue of inverted input $\bar{A}_4$, XNOR output $\bar{f}_4$. Each XOR circuit 50 is a pair of cross coupled PFETs 52, 54. The XOR input pairs $A_4$, $B_1$ or $\bar{A}_4$, B are at the drains of PFETs 52, 54. The common connection at the PFET 52, 54 drains provides the logic function output 56. The P book's output pseudo latch 58 is identical to the output pseudo-latch 20 of FIG. 1A and provides additional drive to pull $f_4$ or $\bar{f}_4$ to ground. The output pseudo latch 58 operates as described for pseudo latch 20 above.

Having thus defined the basic logic building blocks of the first preferred embodiment logic family, any desired higher order logic function, such as a multiplier, can be constructed. The logic family of the first preferred embodiment can be used to construct a higher order logic block or, if desired, an entire chip. This is so, because it is a basic precept of logic design that any logic function can be implemented using all NOR gates or all NAND gates. Thus, following the single additional rule that a book must not immediately precede or immediately follow another book of the same type, the logic family of the first preferred embodiment provides superior results over prior art logic families. The logic family of the first preferred embodiment provides the performance advantage of pass gates while insuring that the signal loss inherent in pass gate logic does not propagate and that the propagating signal is redriven at least, at every other logic stage.

The second preferred embodiment, like the first, has a minor constraint to effect the same result. For this second preferred embodiment logic family, unlike the first preferred embodiment, the logic in each book is a mixture of both PFETs and NFETs and the pseudo-latches also includes both an PFET and a NFETs. In the second preferred embodiment, the same constraint must be followed. The constraint is that the same level (high or low) may not be redriven for two successive stages, i.e, the redrive provided by the pseudo latches must alternate between high and low for successive stages.

Figure 3A:
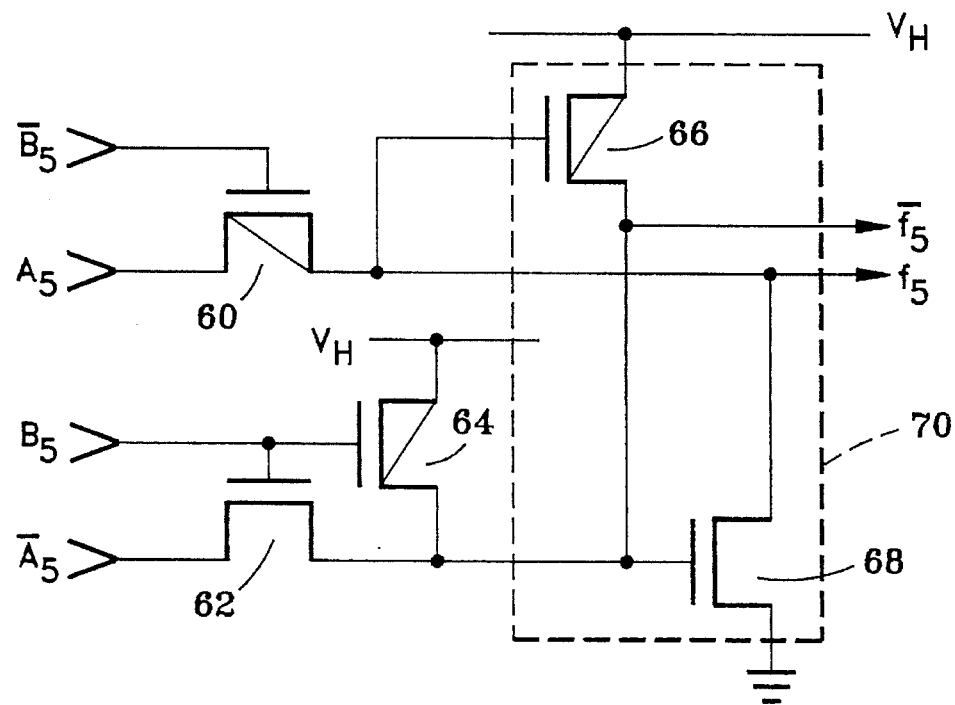
FIGS. 3A–B are schematic diagrams of the AND/OR circuit according to the second preferred embodiment logic family.
Figure 3B:
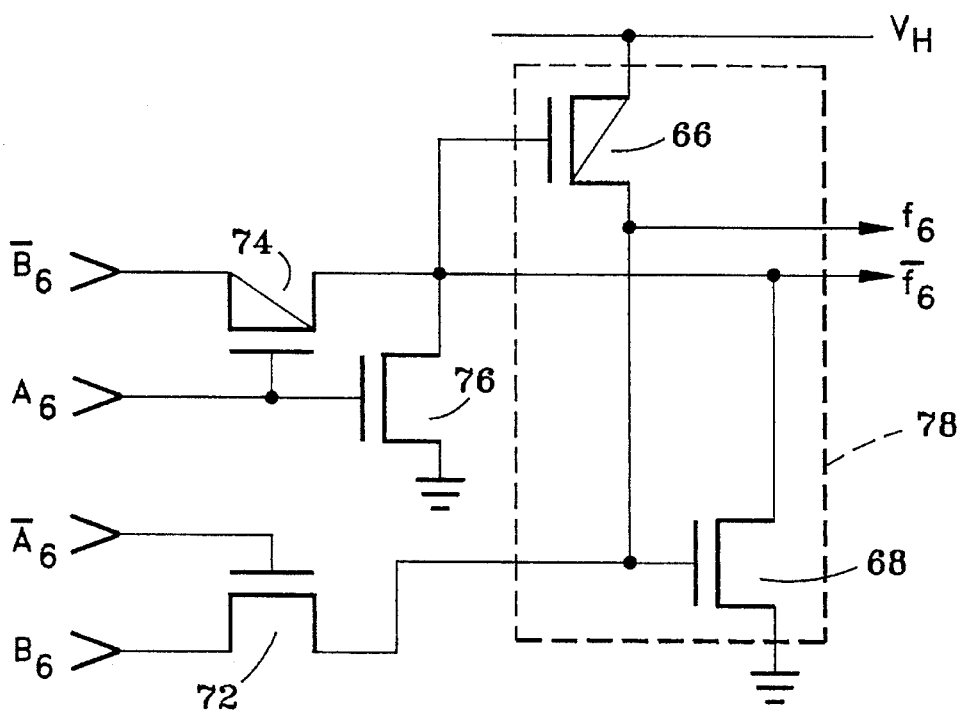

FIGS. 3A and 3B are schematics of the AND/OR books of the second preferred embodiment. For simplicity herein, the books of FIGS. 3A and 3B are identified according to the input connected to the pass gate sources. Thus, the circuit of FIG. 3A is the A book and the circuit of FIG. 3B is the B book. Both A and B books of the second preferred embodiment have complementary outputs and are two input gates. However, for each book, those two inputs are complementary input pairs. Therefore, either book may function as an AND/NAND gates or an OR/NOR. Book function is altered simply by swapping the complementary inputs on both input pairs, i.e. swapping A with $\bar{A}$ and B with $\bar{B}$.

In FIG. 3A, the A book, $f_5=A_5 \cdot B_5$ and $\bar{f}_5=\overline{A_5 \cdot B_5}$. A first input $A_5$ is provided to the source of PFET 60 and its complement $\bar{A}_5$ is provided to the source of NFET 62. PFET 60 is connected, drain to source, between $f_5$ and $A_5$ and NFET 62 is connected, drain to source between $\bar{f}_5$ and $\bar{A}_5$. A second input $B_5$ gates NFET 62. When $B_s$ is high, $\bar{A}_5$ is passed to $\bar{f}_5$. When $B_5$ is low, $\bar{f}_5$ is driven high by PFET 64 which is connected at its gate to $B_5$ and connected, drain to source, between $\bar{f}_5$ and $V_H$. PFET 66, which is gated by $f_5$ and is connected, drain to source, between $\bar{f}_5$ and $V_H$, and NFET 68, which is gated by $\bar{f}_5$ and is connected, drain to source, between $f_5$ and ground, form the output pseudo latch 70. If $A_5$ and $B_5$ are both "1", $f_5$ is high and $\bar{f}_5$ is low, both PFET 66 and NFET 68 are off. If $A_5$ switches to a "0", $f_5$ is pulled low through PFET 60 and $\bar{f}_5$ is pulled high through 62 by $\bar{A}_5$ rising. When $\bar{f}_5$ rises, it turns NFET 68 on, clamping $f_5$ low. A low on $f_5$ turns PFET 66 on, to redrive $f_5$ high. If instead of $A_5$ switching from a "1" to a "0", $B_5$ switches to a "0", PFET 60 is turned off, floating $f_5$ momentarily. NFET 62 is also turned off, but PFET 64 is turned on driving $\bar{f}_5$ high. The high on $\bar{f}_5$ sets the pseudo latch as described above.

In FIG. 3B, the B-book, $f_6=A_6+B_6$ and $\bar{f}_6=\overline{A_6+B_6}$. In this B-book, the complement of first input, $\bar{A}_6$ is provided to the gate of NFET pass gate 72. The first input $A_6$ is provided to the gate of PFET pass gate 74. NFET pass gate 72 is connected, drain to source, between second output $f_6$ and input $B_6$. PFET pass gate 74 is connected, drain to source, between $\bar{f}_6$ and $\bar{B}_6$. When $A_6$ is a low, $\bar{B}_6$ is passed to $\bar{f}_6$ and $\bar{A}_6$ is high passing $B_6$ to $f_6$. With input $A_6$ low, NFET 76, which is connected, drain to source, between $\bar{f}_6$ and ground, is turned off. The B-book's output pseudo latch 78 is identical to the A-book's output pseudo latch 70. So, pseudo latch 78 operates essentially identical to pseudo latch 70.

Figure 4:
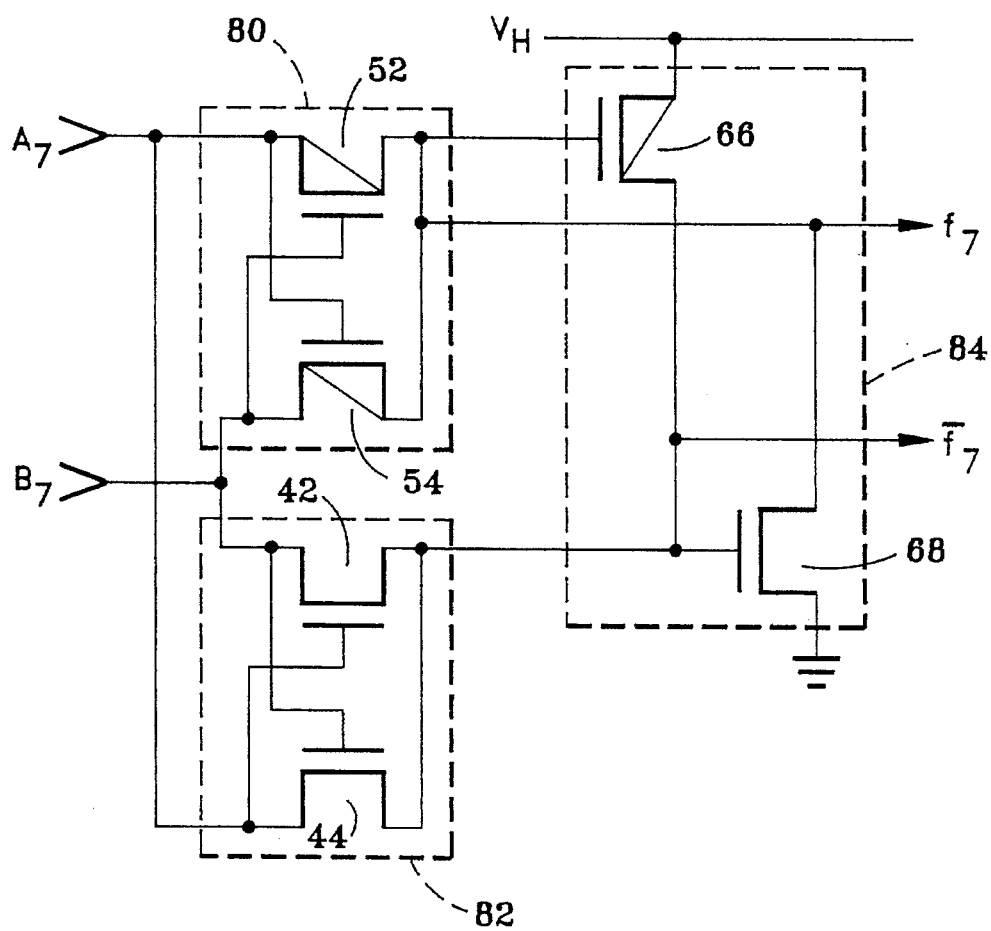
FIG. 4 is a schematic diagram of an XOR/XNOR circuits according to the second preferred embodiment.

FIG. 4 is a schematic diagram of the XOR/XNOR circuit of the second preferred embodiment logic family. The circuit is a cross coupled PFET XOR 80 identical to the cross coupled PFET XOR 50 of FIG. 2B; a cross coupled NFET XNOR 82 identical to the cross coupled NFET XNOR 40 of FIG. 2A; and, an output pseudo latch 84 identical to the output pseudo latch 70 of FIG. 3A. These three functions operate as described above with regard to the first logic family. Output $f_7$ is provided by the PFET XOR 80 and its low level appropriately redriven by pseudo latch 84. The complement output, $\bar{f}_7$, is provided by the NFET XNOR 82 and its high level appropriately redriven by pseudo latch 84. It can be seen that for the XOR/XNOR book of the second embodiment logic family, both inputs are connected to both types of pass gates and both outputs are supplied from both types of pass gates. Therefore, to comply with the constraint, in spirit, and achieve the same effect, only one output, either $f_7$ or $\bar{f}_7$, is available from this book. Consequently, the same circuit serves as both books. Further, by alternating XOR and XNOR stages, the circuit of FIG. 4 may be series connected an unlimited number of times.

In summary, to comply with the constraint for this second preferred embodiment logic family, requiring alternating levels redriven for series connected pass gates, $A_5$, $\bar{B}_6$ can receive inputs from $\bar{f}_5$ $f_6$ or $\bar{f}_7$ and $\bar{A}_5$ $B_6$ can receive inputs from $f_5$, $\bar{f}_6$,or $f_7$. For the XOR and XNOR books, the XOR can receive inputs from $\bar{f}_5$ $f_6$or $\bar{f}_7$ and the XNOR can receive inputs from $f_5$, $\bar{f}_6$ or $f_7$. Alternatively, if both $f_7$ and $\bar{f}_7$ are required, inputs $A_7$, $B_7$, outputs $f_7$, $\bar{f}_7$ or both should be strategically buffered.

Figure 5:
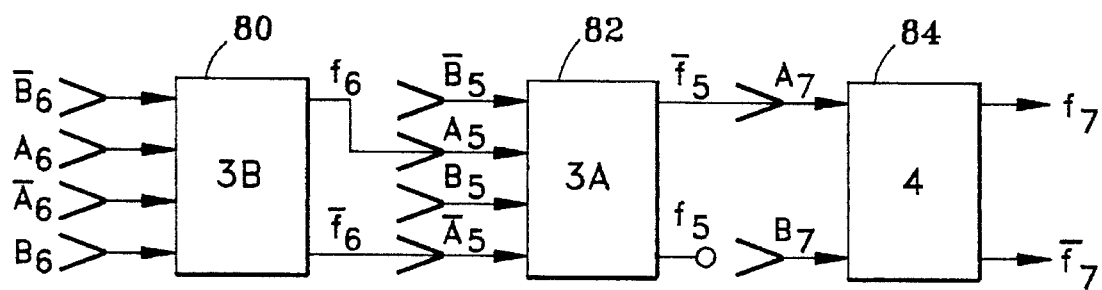
FIG. 5 is a schematic diagram illustrating series connection of a plurality of logic books according to the present invention.

For example, in FIG. 5, a first logic book 80 is coupled in series with a second logic book 82 and a third logic book 84. In accordance with the restriction of the present invention that adjacent logic books coupled in series must be of different types, first logic book 80 is of the type illustrated in FIG. 3B, second logic book 82 is of the type illustrated in FIG. 3A, and third logic book 84 is of the type illustrated in FIG. 4. Further in keeping with the connection restrictions recited above in the preceding paragraph, output $f_1$ from first logic book is connected with input $A_5$ to second logic book 82, and output $f^-_6$ from first logic book 80 is connected with input $A^-_5$ to second logic book 82. Further, output $f^-_5$ from second logic book 82 is connected with input $A_7$ to third logic book 84.

A third preferred embodiment logic family of the present invention includes all of the books from FIGS. 1–4. While this embodiment includes a more robust circuit selection than either of the first two, implementing this embodiment is slightly more complex. However, to implement this third embodiment, as with the first two embodiments, the primary constraint is that series connected books must have opposite logic levels redriven at alternate stages.

While the present invention is described in terms of preferred embodiments, it is understood that numerous variations and modifications will occur to a person skilled in the art without departing in spirit from the claimed invention. Although the present invention is described in terms of a logic family, it is understood that higher order logic functions could be custom designed using the books of the present invention as basic building blocks. A high order logic function could also be optimized such that the result is a series of cascaded pass gates with opposite logic levels redriven on alternate pass gate stages. It is intended that these and other such similar variations fall within the scope and spirit of the present invention. It is intended that the scope of the claims include those modifications and variations that fall within the spirit of the invention.

We claim:

1. An integrated circuit chip including at least one high order logic circuit, said at least one high order logic circuit comprising:

a plurality of logic books; each logic book of said plurality of logic books having complementary outputs; said plurality of logic books being coupled to perform a predetermined logic function; first reinforcing means for reinforcing a first logic level and second reinforcing means for reinforcing a second logic level; said plurality of logic books, said first reinforcing means, and said second reinforcing means being coupled appropriately that for any two logic books of said plurality of logic books which are coupled in series, a first logic book of said two logic books cooperates with one reinforcing means of said first reinforcing means and said second reinforcing means to reinforce one logic level of said first logic level and said second logic level, and a second logic book of said two logic books cooperates with the other reinforcing means of said first reinforcing means and said second reinforcing means than said one reinforcing means to reinforce the other logic level of said first logic level and said second logic level than said one logic level;

and each of said first and second reinforcing means including a pseudo latch connected to said complementary outputs.

2. The integrated circuit chip of claim 1 wherein each logic book of said plurality of logic books is comprised of a logic function circuit in a single transistor type, said single transistor type being of a first transistor type in a first group of logic books of said plurality of logic books and of a second transistor type in a second group of logic books of said plurality of logic books.

3. The integrated circuit chip of claim 1 wherein every said pseudo latch is of a single transistor type, said single transistor type being a first transistor type in a first group of said pseudo latches and of a second transistor type in a second group of said pseudo latches.

4. The integrated circuit chip of claim 2 wherein each said pseudo latch is of a single transistor type, said pseudo latches connected to said first group of logic books being of said second transistor type and said pseudo latches connected to said second group of pseudo latches of said first transistor type.

5. The integrated circuit chip of claim 4 wherein said first transistor type is a P type FET and said second transistor type is a N type FET.

6. The integrated circuit chip of claim 5 wherein each of said plurality of logic books includes at least one pass gate.

7. An integrated circuit including a logic circuit formed from logic books, said circuit comprising:

a plurality of pass gate logic books each of said pass gate logic books having a complementary pair of outputs;

said plurality of logic books being of a first type logic book or a second type logic book;

at least two of said plurality of pass gate logic books being connected in series;

means for reinforcing a first logic level attached to a first group of said complementary pairs of outputs;

means for reinforcing a second logic level attached to a second group of said complementary pairs of outputs; and, said pass gate books being arranged in said logic circuit such that for any two of said plurality of pass gate books being connected in series, the first of said series connected books is of said first type logic book and one logic level is reinforced and the second of said series connected books is of said second type logic book and the other logic level is reinforced.

8. The integrated circuit chip of claim 7 wherein said plurality of pass gate logic books comprises a plurality of logic books with PFET pass gates and a plurality of logic books with NFET pass gates.

9. The integrated circuit chip of claim 8 wherein said means for reinforcing said first logic level comprises a pair of cross coupled NFETs and said means for reinforcing said second logic level comprises a pair of cross coupled PFETs.

10. The integrated circuit chip of claim 8 wherein said pass gate logic books include an AND/NAND book and an OR/NOR book.

11. The integrated circuit chip of claim 9 wherein said pass gate logic books include a pair of XOR/XNOR books.

12. The integrated circuit chip of claim 7 wherein said means for reinforcing said first logic level and said second logic level is a pseudo latch, said first group of complementary pairs of outputs is one each of said pair and said second half of said complementary outputs is the other of each of said pair.

13. The integrated circuit chip of claim 12 wherein said plurality of pass gate books comprises a plurality of logic books having PFET and NFET pass gates.

14. The integrated circuit chip of claim 13 wherein each said pseudo latch is a PFET and NFET with gate and drain cross coupled.

15. The integrated circuit chip of claim 14 wherein said pass gate books include a pair of AND/OR gates.

16. The integrated circuit chip of claim 14 wherein said pass gate books include an XOR/XNOR gate.

17. The integrated circuit chip of claim 7 wherein said plurality of pass gate books further comprises:

a plurality of PFET logic books with pass gates consisting of PFETs;

a plurality of NFET logic books with pass gates consisting of NFETs; and a plurality of logic books including at least one NFET pass gate and at least one PFET pass gate.

18. The integrated circuit chip of claim 17 wherein said first group of complementary pairs of outputs consists of outputs from PFET pass gates and said second group of complementary outputs consists of outputs from NFET pass gates.

19. A logic family for forming multiple stage logic circuits, said logic family comprising:

a plurality of logic books; each logic book of said plurality of logic books having complementary outputs; said plurality of logic books being coupled to perform a predetermined logic function; first reinforcing means for reinforcing a first logic level and second reinforcing means for reinforcing a second logic level; said plurality of logic books, said first reinforcing means, and said second reinforcing means being coupled appropriately that for any two logic books of said plurality of logic books which are coupled in series, a first logic book of said two logic books cooperates with one reinforcing means of said first reinforcing means and said second reinforcing means to reinforce one logic level of said first logic level and said second logic level, and a second logic book of said two logic books cooperates with the other reinforcing means of said first reinforcing means and said second reinforcing means than said one reinforcing means to reinforce the other logic level of said first logic level and said second logic level than said one logic level; and each of said first and second reinforcing means including a pseudo latch connected to said complementary outputs.

20. The logic family of claim 19 wherein each logic book of said plurality of logic books comprises a logic function circuit in a single transistor type, said single transistor type being of a first transistor type in a first group of said logic books and of a second transistor type in a second group of said logic books.

21. The logic family of claim 19 wherein each said pseudo latch is of a single transistor type, said single transistor type being a first transistor type in a first group of pseudo latches and of a second transistor type in a second group of pseudo latches.

22. The logic family of claim 20 wherein every said pseudo latch is of a single transistor type, each said pseudo latch connected to said first group of logic books being of said second transistor type and each said pseudo latch connected to said second group of logic books being of said first transistor type.

23. The logic family of claim 22 wherein said first transistor type is a P type FET and said second transistor type is a N type FET.

* * * * *